(12) United States Patent
Bae et al.

(10) Patent No.: US 12,527,004 B2
(45) Date of Patent: Jan. 13, 2026

(54) NONVOLATILE MEMORY DEVICE AND APPARATUS COMPRISING THE SAME

(71) Applicant: Samsung Electronics Co., Ltd., Suwon-si (KR)

(72) Inventors: Hagyoul Bae, Hanam-si (KR); Jinseong Heo, Seoul (KR); Seunggeol Nam, Suwon-si (KR); Taehwan Moon, Suwon-si (KR); Yunseong Lee, Osan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 603 days.

(21) Appl. No.: 17/896,481

(22) Filed: Aug. 26, 2022

(65) Prior Publication Data

US 2023/0068706 A1    Mar. 2, 2023

(30) Foreign Application Priority Data

Aug. 27, 2021   (KR) .................. 10-2021-0114243

(51) Int. Cl.
*H10B 63/00*    (2023.01)
*H10B 43/27*    (2023.01)
*H10B 51/20*    (2023.01)

(52) U.S. Cl.
CPC ............. *H10B 63/34* (2023.02); *H10B 43/27* (2023.02); *H10B 51/20* (2023.02)

(58) Field of Classification Search
CPC ........ H10B 63/34; H10B 43/27; H10B 51/20; H10B 63/84; H10B 43/10; H10B 51/10; H10D 64/033; H10D 64/037; H10N 70/20; H10N 70/826; H10N 70/861; H10N 70/8833
See application file for complete search history.

(56) References Cited

U.S. PATENT DOCUMENTS 9,153,597 B2 *  10/2015  Kim .................... H01L 21/3105
9,331,090 B2     5/2016  Alsmeier et al.
9,576,971 B2 *   2/2017  Zhang .................... H10D 30/69
(Continued)

FOREIGN PATENT DOCUMENTS

CN           110326111 A      10/2019
KR    10-2014-0138121 A      12/2014
(Continued)

OTHER PUBLICATIONS

Korean Office Action dated May 22, 2025 issued in Korean Patent Application No. 10-2021-0114243 (English translation has been provided).

*Primary Examiner* — Allison Bernstein
(74) *Attorney, Agent, or Firm* — HARNESS, DICKEY & PIERCE, P.L.C.

(57) ABSTRACT

A non-volatile memory device is provided. The nonvolatile memory device includes a metal pillar, a channel layer separated from the metal pillar and surrounding a side surface of the metal pillar, a source arranged on one end of the channel layer, a drain arranged on the other end of the channel layer, a gate insulating layer surrounding a side surface of the channel layer, and a plurality of insulating elements and a plurality of gate electrodes alternately arranged along a surface of the gate insulating layer and surrounding a side surface of the gate insulating layer.

19 Claims, 9 Drawing Sheets

(56) References Cited

U.S. PATENT DOCUMENTS

| | | | |
|---|---|---|---|
| 10,424,598 B2 * | 9/2019 | Liu | G11C 11/223 |
| 10,923,502 B2 * | 2/2021 | Sato | H10B 51/30 |
| 2019/0259778 A1 | 8/2019 | Yoo | |
| 2020/0135758 A1 | 4/2020 | Park et al. | |
| 2020/0227727 A1 | 7/2020 | Li | |
| 2020/0343307 A1 | 10/2020 | Lee et al. | |
| 2020/0365613 A1 * | 11/2020 | Wang | H10D 64/693 |
| 2021/0020659 A1 | 1/2021 | Chen | |

FOREIGN PATENT DOCUMENTS

| | | |
|---|---|---|
| KR | 10-1872122 B1 | 6/2018 |
| KR | 10-2019-0105174 A | 9/2019 |
| KR | 10-2020-0125148 A | 11/2020 |
| WO | WO-2013/141968 A1 | 9/2013 |

\* cited by examiner

NONVOLATILE MEMORY DEVICE AND APPARATUS COMPRISING THE SAME

CROSS-REFERENCE TO RELATED APPLICATION

This application is based on and claims priority under 35 U.S.C. § 119 to Korean Patent Application No. 10-2021-0114243, filed on Aug. 27, 2021, in the Korean Intellectual Property Office, the disclosure of which is incorporated by reference herein in its entirety.

BACKGROUND

Some example embodiments relate to non-volatile memory devices and apparatuses including the same.

As a semiconductor memory device, a non-volatile memory device, for example, at least one of Programmable ROM (PROM), Erasable PROM (EPROM), Electrically EPROM (EEPROM), Flash Memory Device, etc., are memory devices in which stored data is not erased even when the supply of power is stopped.

Because metals, dielectrics, and semiconductor layers are integrated in a nonvolatile memory device, a self-heating effect may become detrimental, serious, or quite serious when the nonvolatile memory device is operated for a long time.

SUMMARY

Provided are nonvolatile memory devices including a metal filler/metal pillar.

Additional aspects will be set forth in part in the description which follows and, in part, will be apparent from the description, or may be learned by practice of various example embodiments of the disclosure.

According to an aspect of an embodiment, a nonvolatile memory device includes: a metal pillar; a channel layer separated from the metal pillar and surrounding a side surface of the metal pillar; a source on one end of the channel layer; a drain on another end of the channel layer; a gate insulating layer surrounding a side surface of the channel layer; and a plurality of insulating elements and a plurality of gate electrodes that alternate along a surface of the gate insulating layer and surrounding a side surface of the gate insulating layer.

Alternatively or additionally, at least one of the channel layer, the gate insulating layer, and the gate electrode may have a symmetrical structure with respect to the metal pillar.

The nonvolatile memory device may further include an insulating material filled in a space between the metal pillar and the channel layer.

Alternatively or additionally, the insulating material may include at least one of silicon oxide and a thermally conductive ceramic.

The nonvolatile memory device may further include a conductive line in contact with the metal pillar and exposed to the outside of the channel layer through the channel layer.

Alternatively or additionally, a reference voltage may be applied to the metal pillar through the conductive line.

Alternatively or additionally, the reference voltage may be constant, and may not be dependent on voltages applied to the plurality of gate electrodes.

Alternatively or additionally, the reference voltage may be within a voltage range of voltages applied to the plurality of gate electrodes.

Alternatively or additionally, the metal pillar may be configured to be grounded.

In addition, the gate insulating layer may include at least one of SiO, AlO, SiON, and SiN.

The nonvolatile memory device may further include a ferroelectric layer between the plurality of gate electrodes and surrounding a side surface of the gate insulating layer.

Alternatively or additionally, the ferroelectric layer may include a material represented by $MO_2$ (where M is Hf, Zr, or a combination of Hf and Zr) as a base material.

Alternatively or additionally, the ferroelectric layer may further include least one dopant material selected from the group consisting of or including C, Si, Ge, Sn, Pb, Al, Y, La, Gd, Mg, Ca, Sr Ba, Ti, Zr, Hf, and a combination of C, Si, Ge, Sn, Pb, Al, Y, La, Gd, Mg, Ca, Sr Ba, Ti, Zr, Hf.

Alternatively or additionally, the gate insulating layer may include: a charge tunneling layer through which charges are configured to be tunneled; a charge trap layer configured to stored introduced charges; and a charge blocking layer configured to block a charge transfer between the charge trap layer and the gate electrode.

The nonvolatile memory device may further include a variable resistance layer in contact with the channel layer between the metal pillar and the channel layer.

The nonvolatile memory device may further include a bit line electrically connected to the drain and configured to apply a voltage to the nonvolatile memory device to perform at least one of program, read, and erase operations.

BRIEF DESCRIPTION OF THE DRAWINGS

The above and other aspects, features, and/or advantages of some example embodiments of inventive concepts will be more apparent from the following description taken in conjunction with the accompanying drawings, in which.

DETAILED DESCRIPTION OF SOME EXAMPLE EMBODIMENTS

Figure 1:
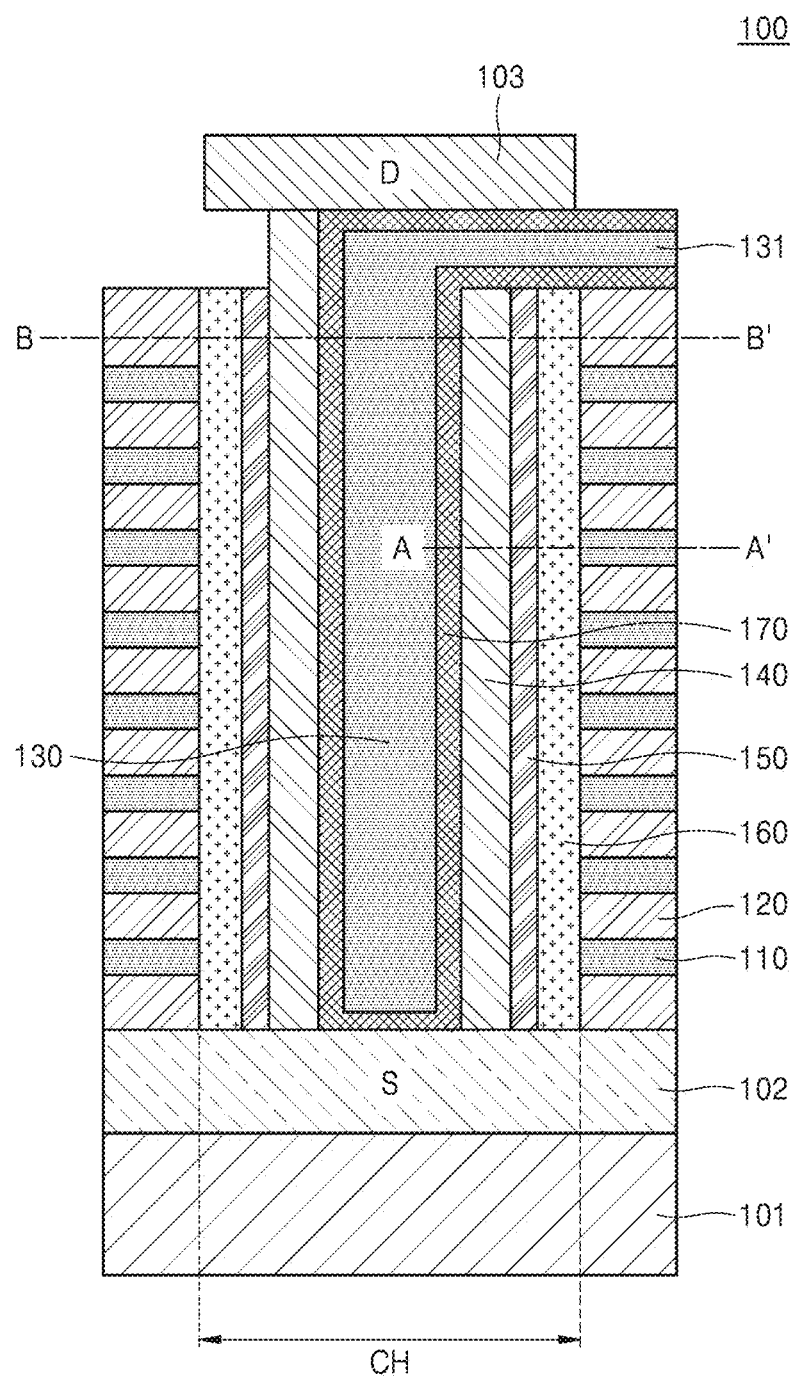
FIG. 1 is a cross-sectional view showing a schematic structure of a nonvolatile memory device according to some example embodiments.

Reference will now be made in detail to various embodiments, examples of which are illustrated in the accompanying drawings, wherein like reference numerals refer to like elements throughout. In this regard, various example embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereafter, inventive concepts will be described more fully with reference to the accompanying drawings. Example embodiments of inventive concept are capable of various modifications and may be embodied in many different forms. In the drawings, like reference numerals refer to like constituent elements, and the size of each constituent element may be exaggerated for clarity and convenience of description.

When an element or layer is referred to as being "on" or "above" another element or layer, the element or layer may be directly on another element or layer or intervening elements or layers.

It will be understood that, although the terms "first", "second", etc. may be used to describe various elements, these terms are only used to distinguish one element from another. These terms do not limit the difference in the material or structure of the constituent elements.

The singular forms "a," "an" and "the" are intended to include the plural forms as well, unless the context clearly indicates otherwise. Also, when a part "comprises" or "includes" an element in the specification, unless otherwise defined, other elements are not excluded from the part and the part may further include other elements.

Also, as used herein, the term "units" or " . . . modules" denote units or modules that process at least one function or operation, and may be realized by hardware, software, or a combination of hardware and software.

The term "above" and similar directional terms may be applied to both singular and plural.

The operations of all methods described herein may be performed in any suitable order unless otherwise indicated herein and/or otherwise clearly contradicted by context. The use of any and all examples, or exemplary/example language (e.g., "such as") provided herein, is intended merely to better illuminate inventive concepts and does not pose a limitation on the scope of the inventive concept unless otherwise claimed.

Figure 2:
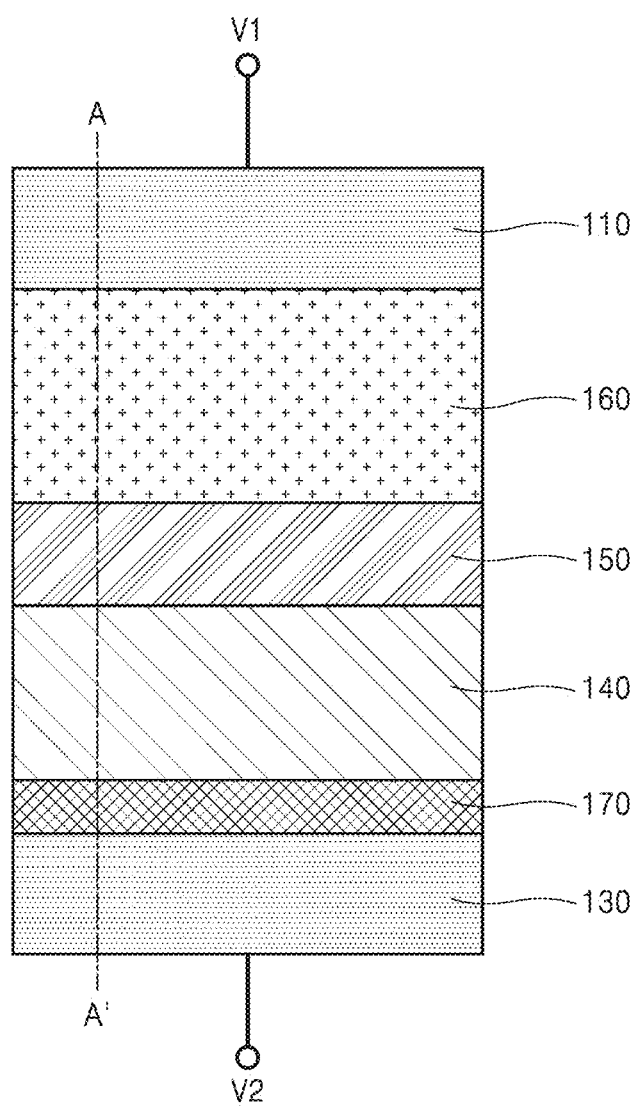
FIG. 2 is a cross-sectional view taken along line A-A' of the nonvolatile memory device of FIG. 1.
Figure 3:
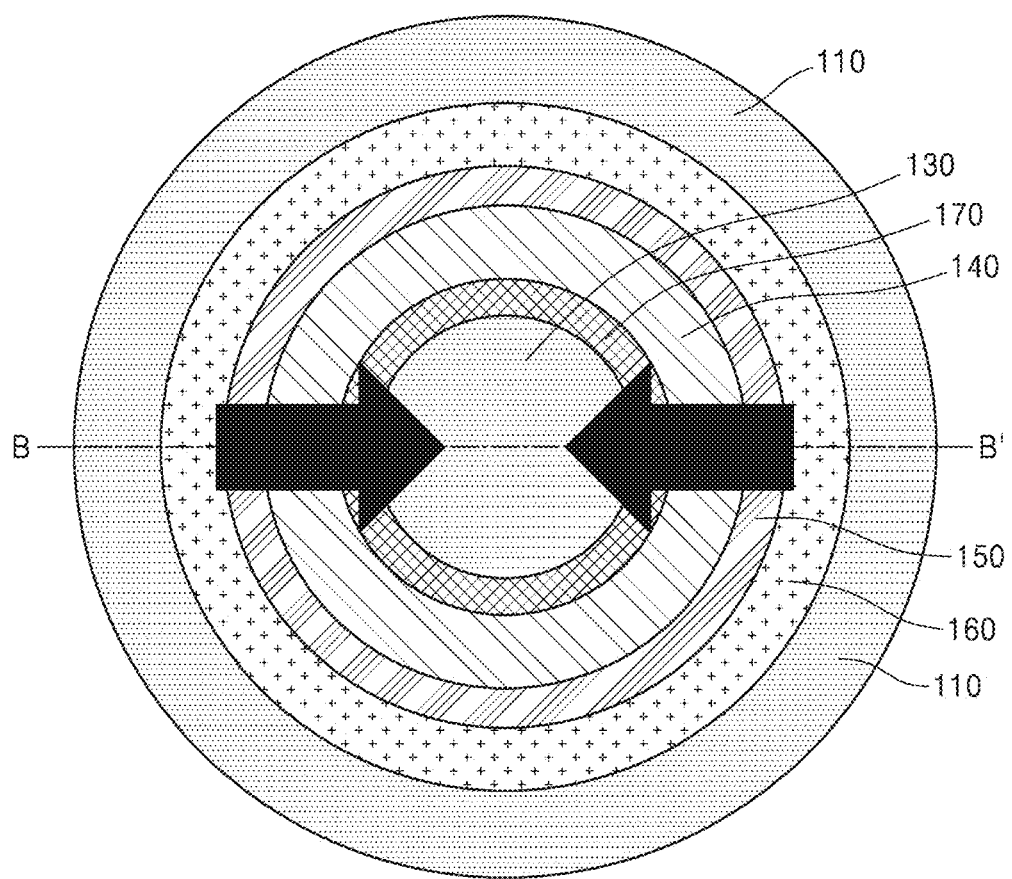
FIG. 3 is a cross-sectional view taken along line B-B' of the nonvolatile memory device of FIG. 1.
Figure 4:
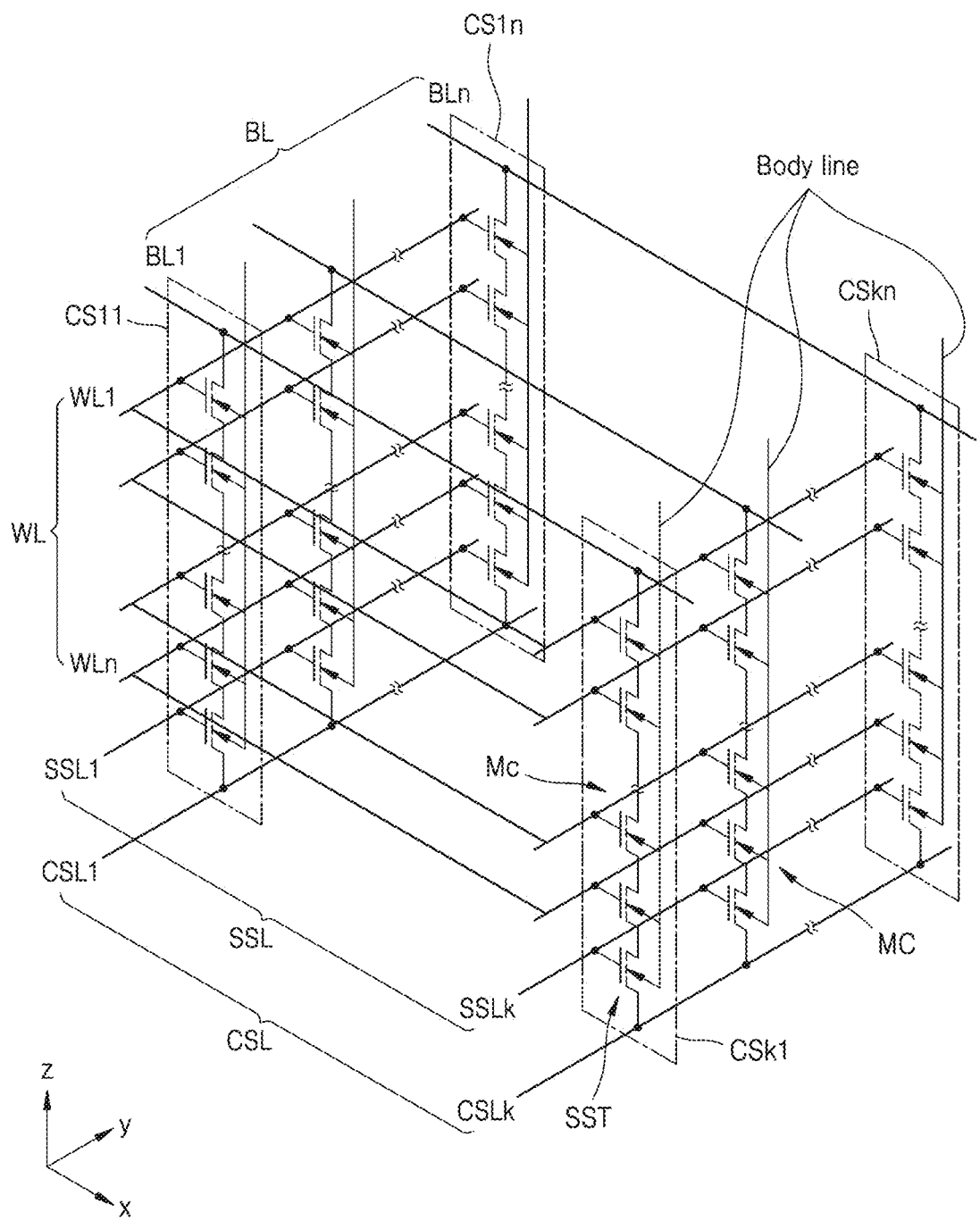
FIG. 4 is an equivalent circuit diagram of a plurality of nonvolatile memory devices.

FIG. 1 is a cross-sectional view showing a schematic structure of a nonvolatile memory device 100 according to some example embodiments. FIG. 2 is a cross-sectional view taken along line A-A' of the nonvolatile memory device 100 of FIG. 1. FIG. 3 is a cross-sectional view taken along line B-B' of the nonvolatile memory device 100 of FIG. 1. FIG. 4 is an equivalent circuit diagram of a plurality of nonvolatile memory devices.

The nonvolatile memory device 100 according to some example embodiments is a vertical NAND (VNAND) memory in which a plurality of memory cells MC are vertically arrayed; however, example embodiments are not limited thereto, and the nonvolatile memory device 100 may be another nonvolatile memory device such as a hysteresis device.

A detailed configuration of the nonvolatile memory device 100 will be described with reference to FIGS. 1 to 4. First, referring to FIG. 1, the nonvolatile memory device 100 may include a substrate 101 and a cell string arranged on the substrate 101. Although one cell string is illustrated in the drawing, the nonvolatile memory device 100 may include a plurality of cell strings. The plurality of cell strings may be provided in k*n and arranged in a matrix form, and may be named Csij (1≤i≤k, 1≤j≤n) according to the position of each row and column. Herein, k may be greater than, less than, or equal to n.

The substrate 101 may include a silicon material doped with a first type impurity. For example, the substrate 101 may include a silicon material doped with a p-type impurity. For example, the substrate 101 may be a p-type well (e.g., a pocket p-well). Hereinafter, it is assumed that the substrate 101 is p-type silicon (e.g., doped with/including boron). However, the substrate 101 is not limited to including p-type silicon.

A doped region 102 is provided on the substrate 101. For example, the doped region 102 may have a second type different from that of the substrate 101. For example, the doped region 102 may have an n-type (e.g., doped with/ including at least one of arsenic or phosphorus). Hereinafter, it is assumed that the doped region 102 is an n-type. However, the doped region 102 is not limited to the n-type. The doped region 102 may be connected to a common source line CSL.

As shown in the circuit diagram of FIG. 4, each cell string CSij is connected to a bit line BL, a string select line SSL, a word line WL, and a common source line CSL.

The cell string CSij includes memory cells MC and a string select transistor SST. The memory cells MC and the string select transistor SST of each cell string CSij may be stacked in a height direction, e.g. in a direction perpendicular to a surface of the substrate 101.

Rows of the plurality of cell strings CS are respectively connected to different string selection lines SSL1 to SSLk. For example, the string select transistors SSTs of the cell strings CS11 to CS1n are commonly connected to the string select line SSL1. The string select transistors SST of the cell strings CSk1 to CSkn are commonly connected to the string select line SSLk.

Columns of the plurality of cell strings CS are respectively connected to different bit lines BL1 to BLn. For example, the memory cells MC and the string select transistors SST of the cell strings CS11 to CSk1 may be commonly connected to the bit line BL1, and the memory cells MC and the string select transistors SST of the cell strings CS1n to CSkn may be commonly connected to the bit line BL (BLn).

Rows of the plurality of cell strings CS may be respectively connected to different common source lines CSL1 to CSLk from each other. For example, the string select transistors SST of the cell strings CS11 to CS1n may be commonly connected to the common source line CSL1, and the string select transistors SST of the cell strings CSk1 to CSkn may be commonly connected to the common source line CSLk.

Memory cells MC located at the same height from the substrate 101 (or the string select transistors SST) are commonly connected to one word line WL, and the memory cells MC located at different heights may be respectively connected to different word lines WL1 to WLm from each other. The memory cells MC may be single-level cells, or alternatively maybe multi-level cells; however, example embodiments are not limited thereto.

The circuit structure shown is an example. For example, the number of rows of the cell strings CS may be increased or decreased. As the number of rows of the cell string CS is changed, the number of string selection lines connected to the rows of the cell string CS and the number of cell strings CS connected to one bit line BL may also be changed. As the number of rows of the cell strings CS is changed, the number of common source lines connected to the rows of the cell strings CS may also be changed.

The number of columns of the cell strings CS may also be increased or decreased. As the number of columns of the cell string CS is changed, the number of bit lines BL connected to the columns of the cell strings CS and the number of cell strings CS connected to one string selection line may also be changed.

The height of the cell string CS may also be increased or decreased. For example, the number of memory cells MC stacked on each of the cell strings CS may be increased or decreased. As the number of memory cells MC stacked on each cell string CS is changed, the number of word lines WL may also be changed. For example, the number of string select transistors provided to each of the cell strings CS may be increased. As the number of string select transistors provided to each of the cell strings CS is changed, the number of string select lines or common source lines may also be changed. When the number of string select transistors increases, the string select transistors may be stacked in the same shape as the memory cells MC.

For example, writing and/or reading may be performed in units of rows of the cell strings CS. The cell strings CS may be selected in units of one row by the common source line CSL, and the cell strings CS may be selected in units of one row by the string selection lines SSL. Also, a voltage may be applied to the common source lines CSL which form a unit including at least two common source lines. A voltage may be applied to all of the common source lines CSL as a unit.

In the selected row of the cell strings CS, writing and/or reading may be performed in units of pages. A page may be one row of the memory cells MC connected to one word line WL. In the selected row of the cell strings CSs, the memory cells MC may be selected in units of pages by word lines WLs.

As shown in FIG. 1, in the cell string CS, a plurality of gate electrodes 110 and a plurality of insulating elements 120 extending in a horizontal direction may be alternately arranged on the substrate 101. For example, the plurality of gate electrodes 110 and the plurality of insulating elements 120 may be alternately stacked in a vertical direction perpendicular to a horizontal direction.

The gate electrode 110 may include a metal material and/or a highly doped silicon material such as a highly doped polysilicon material. The gate electrode 110 may include at least one selected from the group consisting of or including a metal, a metal nitride, a metal carbide, polysilicon, and a combination thereof. For example, the metal may include aluminum (Al), tungsten (W), molybdenum (Mo), titanium (Ti), or tantalum (Ta), the metal nitride may include a titanium nitride film (TiN film) or a tantalum nitride film (TaN film), and the metal carbide may include a metal carbide doped (or contained) with aluminum or silicon, specific examples may include TiAlC, TaAlC, TiSiC or TaSiC.

The gate electrode 110 may have a structure in which a plurality of materials are stacked. For example, the gate electrode 110 may have a stacked structure of a metal nitride layer/metal layer, such as TiN/Al, or a stacked structure of a metal nitride layer/metal carbide layer/metal layer, such as TiN/TiAlC/W. The gate electrode 110 may include a titanium nitride layer (TiN) or molybdenum (Mo), and the example materials may be used in variously modified forms.

The plurality of insulating elements 120 may include silicon oxide, but is not limited thereto. The insulating element 120 may serve as a spacer for insulation between conductive layers.

Each gate electrode 110 may be connected to any one of a word line WL and a string selection line SSL.

A channel hole CH vertically penetrating through the plurality of gate electrodes 110 and the plurality of insulating elements 120 alternately arranged is provided.

The channel hole CH may include a plurality of layers. In some example embodiments, a metal pillar 130, a channel layer 140 separated from the metal pillar 130 and surrounding a side surface of the metal pillar 130, a gate insulating layer 150 surrounding a side surface of the channel layer 140, and a ferroelectric layer 160 surrounding a side surface of the gate insulating layer 150 may be arranged in the channel hole CH. Alternatively or additionally, the channel hole CH may further include an insulating material 170 filling a space between the metal pillar 130 and the channel layer 140.

The outermost layer of the channel hole CH may be the ferroelectric layer 160. The ferroelectric layer 160 may have a negative capacitance in a specific operating region, and thus, when the ferroelectric layer 160 is applied to a stack of the gate electrode 110, a sub-threshold swing value may be reduced.

The ferroelectric layer 160 may include one or two or more materials selected from the group consisting of or including hafnium oxide ($HfO_2$), zirconium oxide ($ZrO_2$), hafnium-zirconium oxide ($HfxZr1-xO_2$, where $0<x<1$), and a combination thereof. These metal oxides may exhibit ferroelectricity even in a very thin film of a few nm level, and thus, may be applied to an existing silicon-based semiconductor device process to increase mass productivity.

The ferroelectric layer 160 may include one or two or more materials selected from the group consisting of or including hafnium oxide ($HfO_2$), zirconium oxide ($ZrO_2$), hafnium-zirconium oxide ($HfxZr1-xO_2$, where $0<x<1$), and a combination thereof as a base material, and may further include one or two or more dopant materials selected from the group consisting of or including C, Si, Ge, Sn, Pb, Al, Y, La, Gd, Mg, Ca, Sr Ba, Ti, Zr, Hf, and a combination thereof. The content of the dopant material may be greater than 0 at %, more than 0.2 at %, more than 0.5 at %, more than 1 at %, more than 2 at %, more than 3 at %, less than 10 at %, less than 8 at %, less than 7 at %, or less than 6 at % compared to a metal element of the base material.

In addition, the ferroelectric layer 160 may include an orthorhombic crystal phase. For example, the ferroelectric layer 160 may include several crystalline phases, such as an orthorhombic crystal phase and a tetragonal crystal phase, but may include the orthorhombic crystal phase dominantly or in the largest proportion among all crystalline phases.

The ferroelectric layer 160 may be classified into a high dielectric according to the presence and/or size of residual polarization, a composition of a metal oxide, a type and ratio of a doping element, a crystal phase, and the like. The type and/or content of each element may be measured according to various methods, for example, at least one of X-ray photoelectron spectroscopy (XPS), Auger electron spectroscopy (AES), inductively coupled plasma (ICP), etc. may be used. Alternatively or additionally, the crystalline phase distribution may be confirmed by various methods, for example, at least one of Transmission electron microscopy (TEM), Grazing Incidence X-ray Diffraction (GIXRD), etc. may be used.

The gate insulating layer 150 may be arranged on an inner surface of the ferroelectric layer 160. The gate insulating layer 150 may include silicon oxide. The channel layer 140 may be conformally formed on an inner surface of the gate insulating layer 150. The channel layer 140 may include a semiconductor material doped in a first type (e.g. a first conductivity type). The channel layer 140 may include a silicon material doped with the same type as that of the substrate 101. For example, when the substrate 101 includes a silicon material doped with a p-type, the channel layer 140 may also include a silicon material doped with a p-type. Alternatively, the channel layer 140 may include a material, such as Ge, IGZO, or GaAs.

The metal pillar 130 may be arranged inside the channel layer 140. The metal pillar 130 may include a metal material having high thermal and/or electrical conductivity. The metal pillar 130 described above may release heat generated in the nonvolatile memory device 100 to the outside, and/or may maintain a constant potential with an externally applied voltage.

The insulating material 170 may be filled between the metal pillar 130 and the channel layer 140. The insulating material 170 includes, for example, silicon oxide, but is not limited thereto The insulating material 170 may electrically insulate the metal pillar 130 from the memory cell MC and, at the same time, transfer heat generated in the memory cell MC to the metal pillar 130. For example, the insulating material 170 may include a thermally conductive insulator, such as thermally conductive ceramic.

The channel layer 140 may be in contact with the doped region 102, that is, the common source region.

A drain 103 may be provided on the channel hole CH. The drain 103 may include a silicon material, e.g. single-crystal silicon material, doped in a second type. For example, the drain 103 may include a silicon material doped with an n-type.

A bit line BL may be provided on the drain 103. The drain 103 and the bit line BL may be connected through contact plugs.

Each of the gate electrodes 110 and the ferroelectric layer 160, the gate insulating layer 150, and the channel layer 140 at positions facing the gate electrode 110 in the horizontal direction (X direction) constitute the memory cell MC.

The memory cells MC are sequentially arranged in the vertical direction (Z direction) to constitute/correspond to the cell string CS. In addition, as shown in the circuit diagram of FIG. 3, both ends of the cell string CS may be connected to a common source line CSL and a bit line BL. By applying a voltage to the common source line CSL and the bit line BL, programming, reading, and erasing processes may be performed on the plurality of memory cells MC.

For example, when a memory cell MC to be written to is selected, a voltage value of the gate electrode 110 of the corresponding memory cell MC is adjusted so that a channel is not formed in the selected memory cell MC, for example, the channel is turned off, and the voltage value of the gate electrode 110 of the unselected memory cells MC is adjusted so that the unselected memory cells MC are channel-on.

Similarly, in a read operation, a read of the selected memory cell MC may be performed. For example, after the gate electrode 110 voltage applied to each gate electrode 110 is adjusted so that the selected memory cells MC are channel-off and the unselected memory cells MC are channel-on, the state (1 or 0) of the memory cell MC may be checked by measuring a current flowing through the corresponding memory cell MC by an applied voltage Vread between the common source line CSL and the bit line BL.

In particular, the ferroelectric layer 160 is a material in which the polarization remains semi-permanently in the material even when the voltage is brought back to 0V after applying a constant voltage, and the polarity (direction) of the residual polarization may depend on the polarity (direction) of an externally applied voltage. By using these characteristics, a semiconductor device having a non-volatile memory characteristic may be implemented. Specifically, the direction of the residual polarization of the ferroelectric layer 160 may be changed while changing the direction of an external electric field applied to the ferroelectric layer 160 by 180 degrees. For example, in the nonvolatile memory device, while applying a positive voltage or a negative voltage to the gate electrode 110, the ferroelectric layer 160 may have a residual polarization corresponding to a low logic value (e.g., information "0") or a high logic value (e.g., information "1"). Also, due to the polarization direction of the ferroelectric layer 160, a difference in conductance may occur between a source 102 and a drain 103, through which information "0" or information "1" may be written or confirmed. Information "0" and information "1" may correspond to programming and erasing.

The memory cells MC of the nonvolatile memory device 100 have a vertically connected structure in which the memory cells MC are integrated. Accordingly, a heat problem that occurs when the nonvolatile memory device is operated for a long time may be deleterious/serious. The metal pillar 130 according to some example embodiments may contact the conductive line 131 connected to the outside through the channel layer 140.

Heat generated when each memory cell MC operates may be effectively or more effectively discharged to the outside of the channel layer 140 through the metal pillar 130 and the conductive line 131. Thus, a self-heating effect/phenomenon may be effectively reduced.

Alternatively or additionally, a reference voltage may be applied to the metal pillar 130 through the conductive line 131. The reference voltage may be constant regardless of or independent of voltages applied to the plurality of gate electrodes 110. For example, a voltage of −6V to +6V may be applied to each of the gate electrodes 110, and the metal pillar 130 may be grounded. However, example embodiments are not limited thereto. For example, a specific voltage within a range of −6V to +6V may be applied to the metal pillar 130 as a reference voltage. Thus, the metal pillar 130 described above may be a body line.

As described above, in the nonvolatile memory device 100 according to some example embodiments, because the metal pillar 130 with high thermal conductivity is arranged in the channel hole CH, heat generated from the memory cell MC may be emitted to the outside of the channel layer 140. Alternatively or additionally, because the metal pillar 130 has high electrical conductivity, a voltage range applied to each memory cell MC may be fixed by applying a reference voltage, and thus, the polarization switching characteristic of the ferroelectric layer 160 may be improved.

So far, the nonvolatile memory device 100 including the ferroelectric layer 160 has been described. However, example embodiments are not limited thereto. Vertical nonvolatile memory devices of other types may also include the metal pillar 130.

Figure 5:
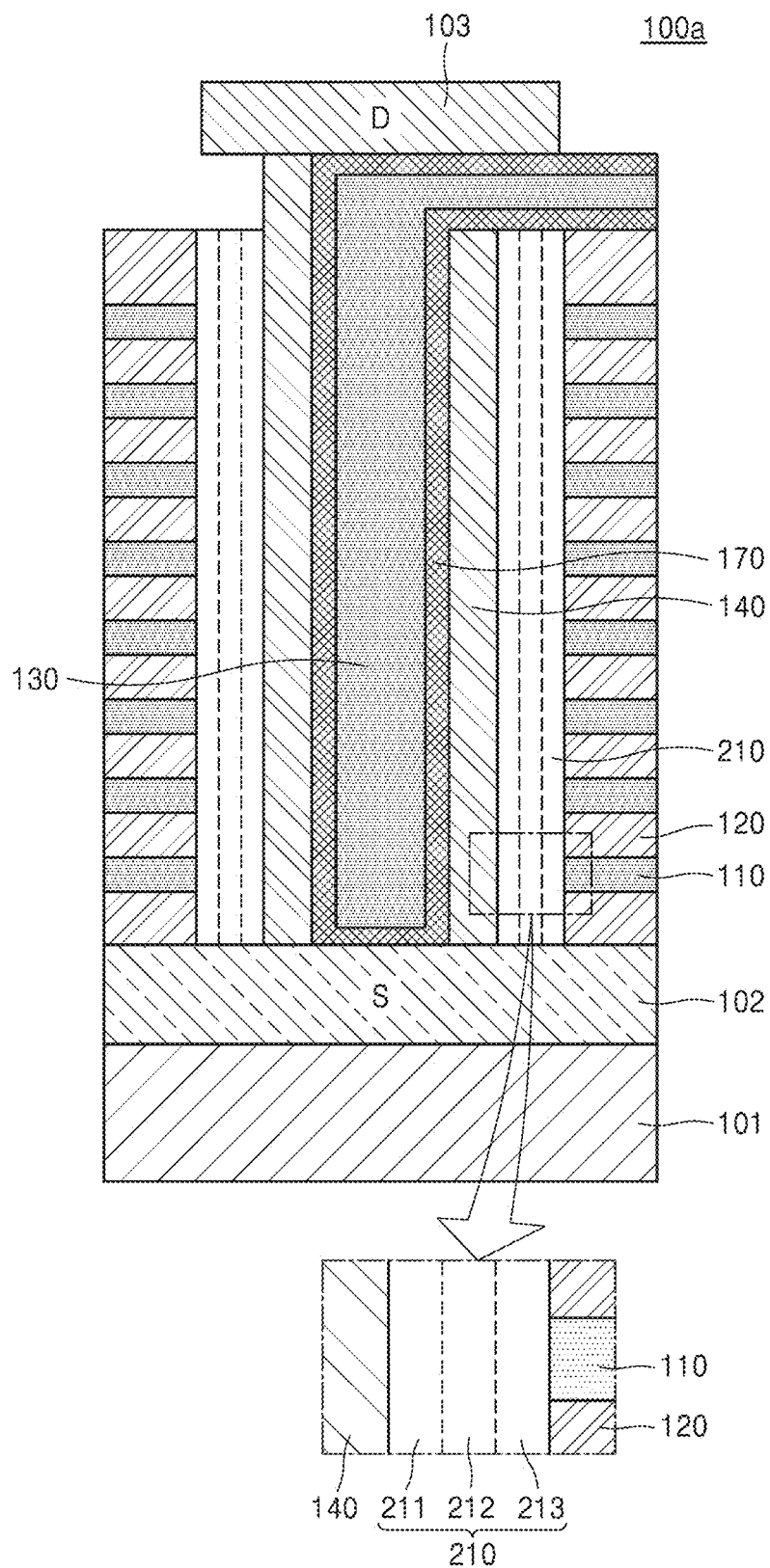
FIG. 5 is a cross-sectional view showing a nonvolatile memory device including a metal pillar according to some example embodiments.

FIG. 5 is a cross-sectional view showing a nonvolatile memory device 100*a* including a metal pillar 130 according to another embodiment. Referring to FIGS. 1 and 5, the nonvolatile memory device 100*a* of FIG. 5 may not include the ferroelectric layer 160. In addition, a gate insulating layer 210 may include a charge tunneling layer 211, a charge trap layer 212, and a charge blocking layer 213 sequentially arranged in a direction from the channel layer 140 to the gate electrode 110.

It is depicted that the charge tunneling layer 211, the charge trap layer 212, and the charge blocking layer 213 are all connected to each other without distinction for each memory cell MC. However, example embodiments are not limited thereto.

The charge tunneling layer 211 is a layer through which charges are tunneled, and may include, for example, silicon oxide or metal oxide, but is not limited thereto.

The charge trap layer 212 may store introduced charges. Charges (e.g., electrons) existing in the channel layer 140 may flow into the charge trap layer 212 due to a tunneling effect or the like. Charges introduced into the charge trap layer 212 may be fixed to the charge trap layer 212. The charge trap layer 212 may include silicon nitride capable of charge trapping.

The charge blocking layer 213 may perform a barrier function to prevent charge transfer between the charge trap layer 212 and the gate electrode 110. An inner surface of the charge blocking layer 213 may contact the charge trap layer 212, and an outer surface of the charge blocking layer 213 may contact the gate electrode 110. The charge blocking layer 213 may include, for example, silicon oxide or metal oxide, but is not limited thereto.

Because the nonvolatile memory device 100a of FIG. 5 also generates heat during a long-time operation, the metal pillar 130 may perform a heat dissipation function of dissipating heat generated in each memory cell MC to the outside.

Figure 6:
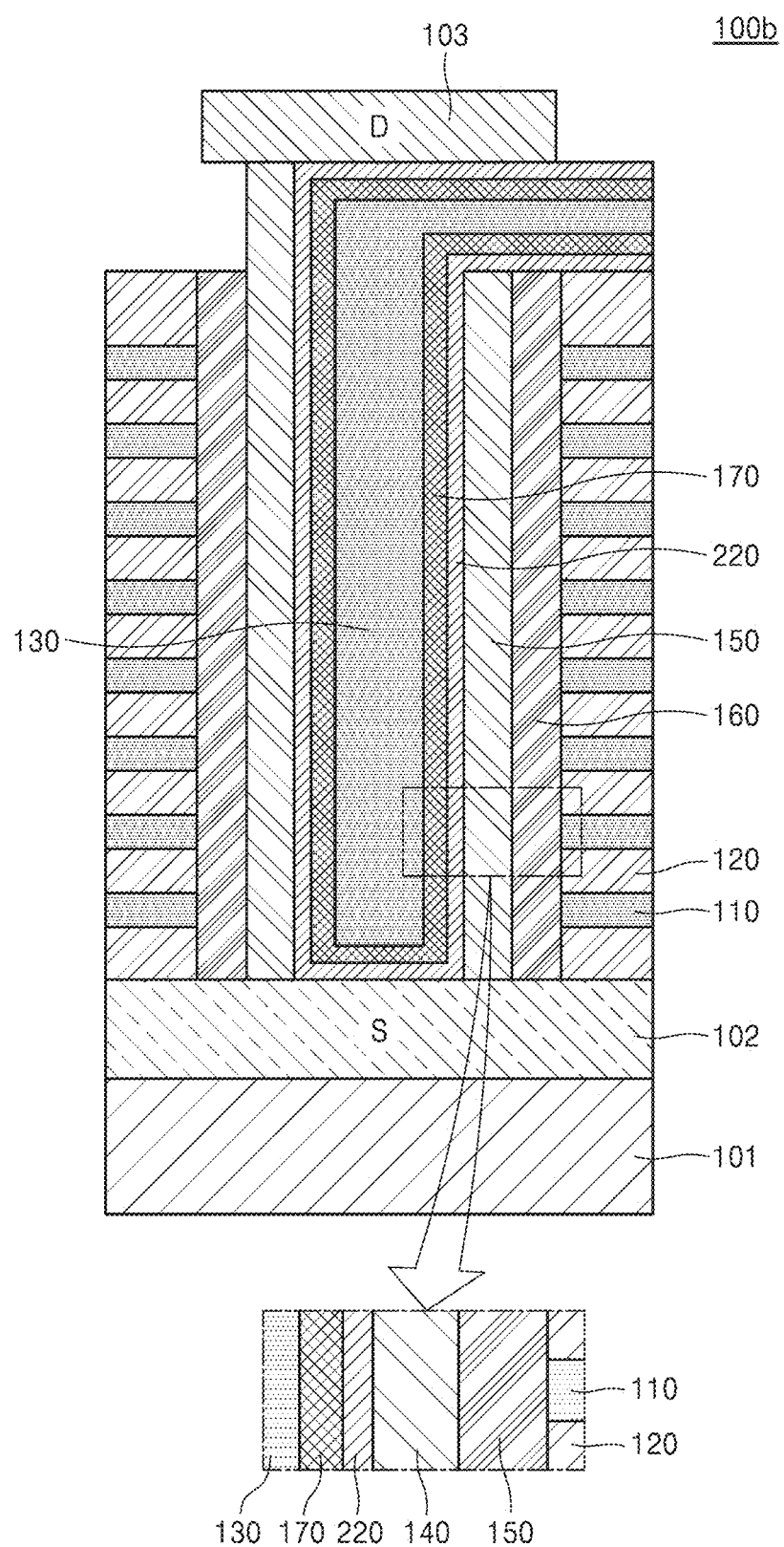
FIG. 6 is a cross-sectional view showing a nonvolatile memory device including a metal pillar according to some example embodiments.

FIG. 6 is a cross-sectional view showing a nonvolatile memory device 100b including a metal pillar 130 according to some example embodiments. Referring to FIGS. 1 and 6, the nonvolatile memory device 100b of FIG. 6 may include a variable resistance layer 220 arranged along an inner surface of the channel layer 140 instead of a ferroelectric layer. The variable resistance layer 220 may be arranged in contact with the channel layer 140 and may be conformally deposited on the channel layer 140.

The variable resistance layer 220 may include an oxide layer. Specifically, the variable resistance layer 220 may include an oxide of at least one element selected from the group consisting of or including zirconium (Zr), hafnium (Hf), aluminum (Al), nickel (Ni), copper (Cu), molybdenum (Mo), tantalum (Ta), titanium (Ti), tungsten (W), chromium (Cr), strontium (Sr), lanthanum (La), manganese (Mn), calcium (Ca), praseodymium (Pr), and silicon (Si). For example, any one of $Rb_2O$, $TiO_2$, BaO, $ZrO_2$, CaO, $HfO_2$, SrO, $Sc_2O_3$, MgO, $Li_2O$, $Al_2O_3$, $SiO_2$, and BeO may be used.

The nonvolatile memory device 100b including the variable resistance layer 220 includes the metal pillar 130 on the central axis of the channel hole CH, and thus, performs a heat sink function for dissipating heat generated from each memory cell MC.

Figure 7:
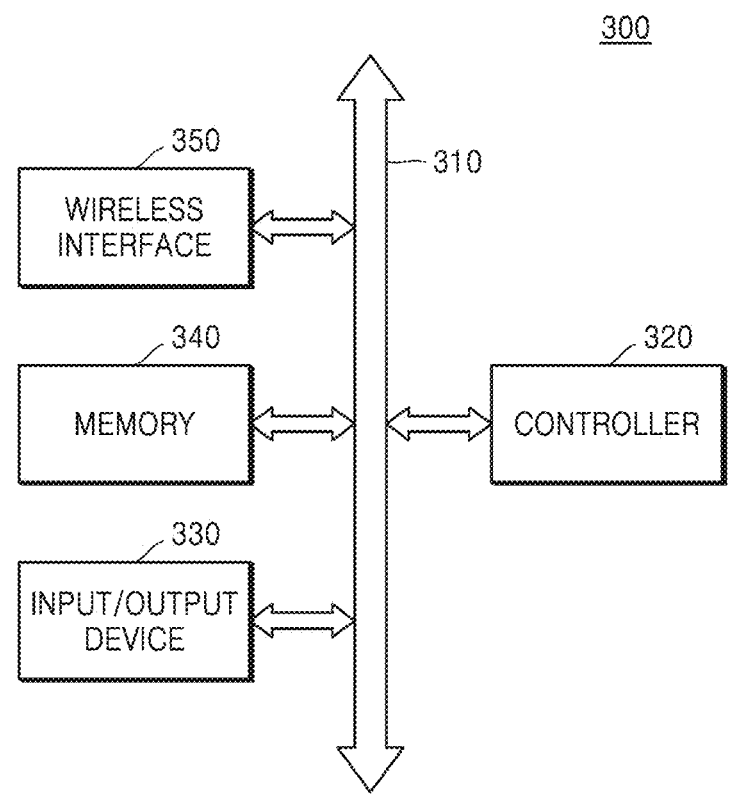
FIG. 7 is a block diagram schematically illustrating an electronic apparatus including a nonvolatile memory device according to some example embodiments.

FIG. 7 is a block diagram schematically illustrating an electronic apparatus 300 including a nonvolatile memory device according to some example embodiments Referring to FIG. 7, the electronic device 300 according to some example embodiments may include a PDA, a laptop computer, a portable computer, a web tablet, a wireless phone, a mobile phone, a digital music player, a wired/wireless electronic device, or a composite electronic device including at least two of the devices described above. The electronic device 300 may include at least one of a controller 320, an input/output device 330, such as a keypad, a keyboard, and a display, a memory 340, and a wireless interface 350 combined to each other through a bus 310, and may include at least one active or passive circuit component.

The controller 320 may include, for example, one or more microprocessors, digital signal processors, microcontrollers, or the like. The memory 340 may be used, for example, to store instructions to be executed by controller 320.

The memory 340 may be used to store user data. The memory 340 may include at least one of the nonvolatile memory devices 100, 100a, and 100b according to embodiments.

The electronic device 300 may use the wireless interface 350 to transmit data to or receive data from a wireless communication network that communicates with an RF signal. For example, the air interface 350 may include at least one of an antenna, a wireless transceiver, and the like. The electronic device 300 may be used in a communication interface protocol like a 3G communication system, such as at least one of a Code-division multiple access (CDMA), Global System for Mobiles (GSM), north American digital cellular (NADC), Enhanced-time-division multiple-access (E-TDMA), Wideband Code Division Multiple Access (WCDAM), or CDMA2000.

Figure 8:
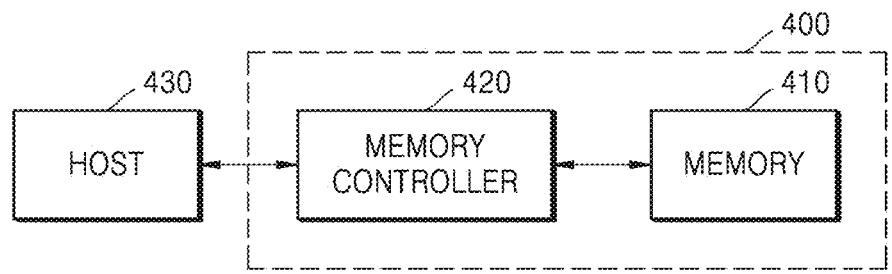
FIG. 8 is a block diagram schematically illustrating a memory system including a nonvolatile memory device according to some example embodiments.

FIG. 8 is a block diagram schematically illustrating a memory system 400 including a nonvolatile memory device according to some example embodiments;

Referring to FIG. 8, nonvolatile memory devices according to some example embodiments may be used to implement a memory system. The memory system 400 may include a memory 410 for storing a large amount of data and a memory controller 420. The memory controller 420 controls the memory 410 to read or write data stored in the memory 410 in response to a read/write request from a host 430. The memory controller 420 may configure an address mapping table for mapping an address provided from the host 430, for example, a mobile device or a computer system, to a physical address of the memory 410. The memory 410 may include at least one of the semiconductor memory devices 100, 100a, and 100b according to various example embodiments of inventive concepts.

Figure 9:
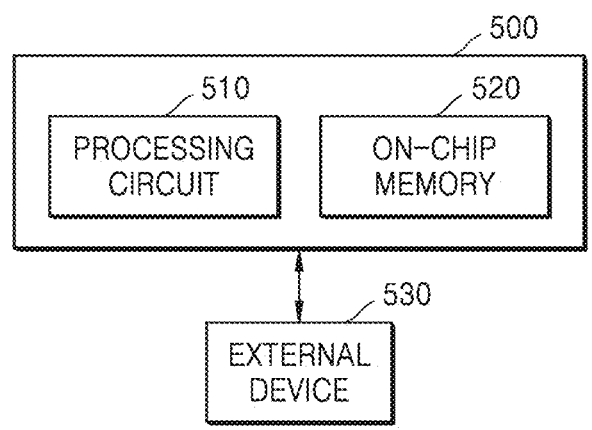
FIG. 9 is a diagram schematically illustrating a neuromorphic device including a memory device according to some example embodiments.

The memory device according to various example embodiments described above may be implemented in a chip form and used as a neuromorphic computing platform. For example, FIG. 9 is a schematic diagram illustrating a neuromorphic device 500 including a memory according to some example embodiments. Referring to FIG. 9, the neuromorphic device 500 may include a processing circuit 510 and/or a memory 520. The memory 520 of the neuromorphic device 500 may include a memory system 10 according to some example embodiments.

The processing circuit 510 may be configured to control functions for driving the neuromorphic device 500. For example, the processing circuit 510 may control the neuromorphic device 500 by executing a program stored in the memory 520 of the neuromorphic device 500.

The processing circuit 510 may include hardware, such as at least one logic circuit, a combination of hardware and software, such as a processor that executes software, or a combination thereof. For example, the processor may include a central processing unit (CPU), a graphics processing unit (GPU), an application processor (AP) in the neuromorphic device 500, an arithmetic logic unit (ALU), a digital processor, a microcomputer, a field programmable gate array (FPGA), System-on-Chip (SoC), a programmable logic unit, a microprocessor, an application-specific integrated circuit (ASIC), etc.

Additionally or alternatively, the processing circuit 510 may read/write various data from an external device 530 and execute the neuromorphic device 500 by using the data. The external device 530 may include an external memory and/or a sensor array including an image sensor (e.g., a CMOS image sensor circuit).

The neuromorphic device 500 shown in FIG. 9 may be applied to a machine learning system. A machine learning system may utilize various artificial neural network organizations and processing models including at least one of a recurrent neural networks (RNN), stacked neural networks (SNN), state-space dynamic neural networks (SSDNN), deep belief networks (DBN), generative adversarial networks (GANs), and/or restricted Boltzmann machines (RBN) selectively including, for example, a convolutional neural network (CNN), a deconvolutional neural network, a long short-term memory (LSTM), and/or a gated recurrent unit (GRU).

The machine learning system may operate based on, for example, at least one of linear regression and/or logistic regression, statistical clustering, Bayesian classification, decision trees, dimensionality reduction, such as principal component analysis, and/or other types of machine learning models such as expert systems, and/or a combination thereof according to an ensemble technique such as random forests. Such a machine learning model may be used to provide various services, for example, an image classification service, a user authentication service based on biometric information or biometric data, an advanced driver assistance system (ADAS), a voice assistant service, an automatic speech recognition (ASR) service, etc. and may be mounted and executed in other electronic devices.

Figure 10:
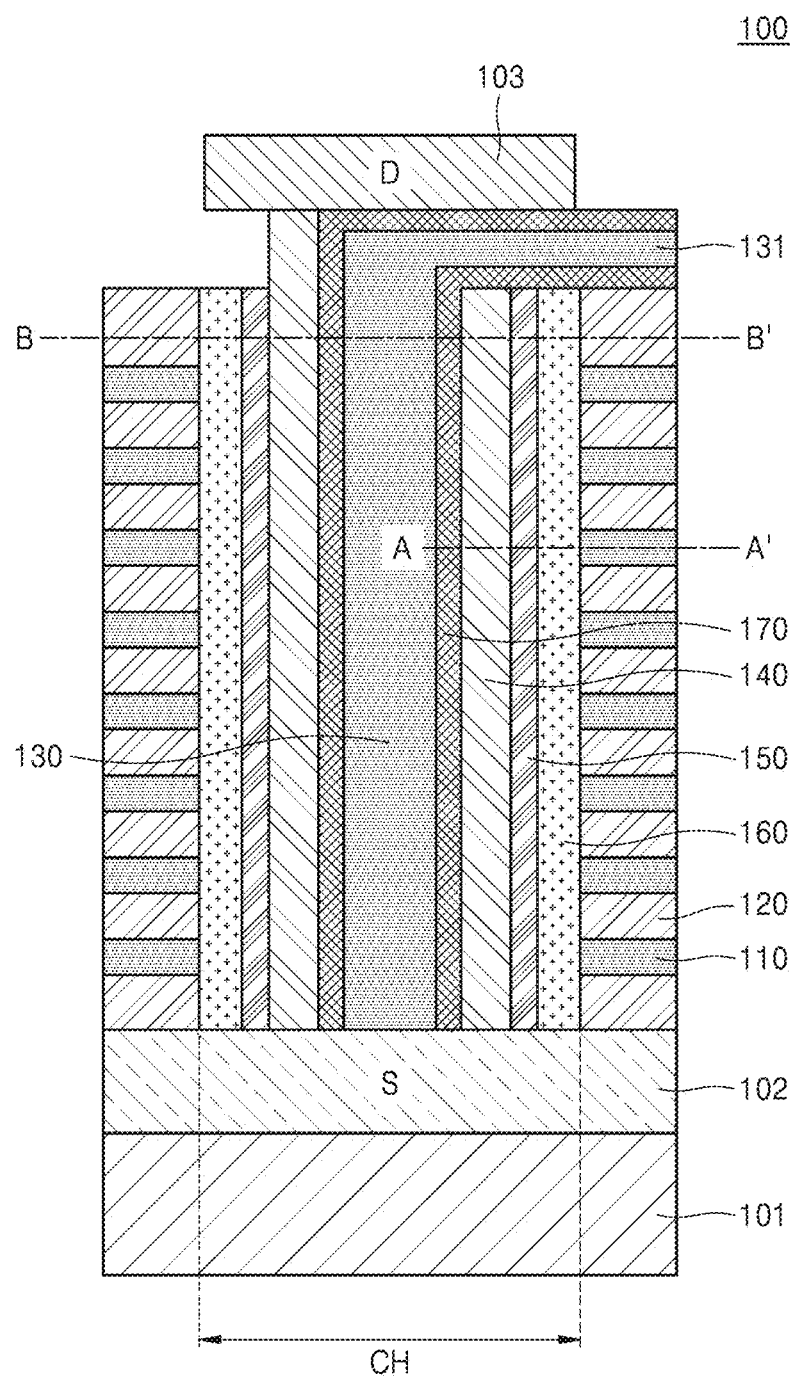
FIG. 10 is a cross-sectional view showing a nonvolatile memory device including a metal pillar according to some example embodiments.

FIG. 10 is a cross-sectional view showing a nonvolatile memory device including a metal pillar according to some example embodiments.

Referring to FIGS. 1 and 10, in the nonvolatile memory device 100 of FIG. 10 the source 102 may be connected the metal pillar 130. For example, there may not be an insulating layer 170 between the source 102 and the metal pillar 130. There may be a short/direct connection between the source 102 and the metal pillar 130. Alternatively or additionally there may be a silicide layer between the metal pillar 130 and the source 102.

The channel layer 140 may have a cylindrical shape. A height of the channel layer 140 may be greater than a diameter of the channel layer 140; however, example embodiments are not limited thereto.

Because the nonvolatile memory device described above includes a metal pillar, heat generated in the memory cell may be effectively dissipated to the outside through the metal pillar.

A constant voltage may be applied to the metal pillar, thus, a voltage range applied to each memory cell MC may be fixed, and, as a result, the switching characteristics of each memory cell MC may be improved.

It should be understood that various example embodiments described herein should be considered in a descriptive sense only and not for purposes of limitation. Descriptions of features or aspects within each example embodiment should typically be considered as available for other similar features or aspects in other embodiments; various example embodiments are not necessarily mutually exclusive with one another. While one or more embodiments have been described with reference to the figures, it will be understood by those of ordinary skill in the art that various changes in form and details may be made therein without departing from the spirit and scope as defined by the following claims.

What is claimed is:

1. A nonvolatile memory device comprising:
   a metal pillar;
   a channel layer separated from the metal pillar and surrounding a side surface of the metal pillar;
   a source on one end of the channel layer;
   a drain on another end of the channel layer and overlapping the metal pillar in a direction parallel to a side surface of the channel layer;
   a gate insulating layer surrounding a side surface of the channel layer;
   a plurality of insulating elements and a plurality of gate electrodes that alternate along a surface of the gate insulating layer and surrounding a side surface of the gate insulating layer; and
   a conductive line in contact with the metal pillar and exposed to outside through the side surface of the channel layer, wherein
   the metal pillar, as a body line, overlaps all of the plurality of gate electrodes in a direction perpendicular to the side surface of the channel layer, and the conductive line is disposed between the drain and the plurality of gate electrodes.

2. The nonvolatile memory device of claim 1,
   wherein at least one of the channel layer, the gate insulating layer, and the plurality of gate electrodes has a symmetrical structure with respect to the metal pillar.

3. The nonvolatile memory device of claim 1, further comprising:
   an insulating material filling a space between the metal pillar and the channel layer.

4. The nonvolatile memory device of claim 3,
   wherein the insulating material includes at least one of silicon oxide and a thermally conductive ceramic.

5. The nonvolatile memory device of claim 1,
   wherein a reference voltage is configured to be applied to the metal pillar through the conductive line.

6. The nonvolatile memory device of claim 5,
   wherein the reference voltage is constant and independent of voltages applied to the plurality of gate electrodes.

7. The nonvolatile memory device of claim 5,
   wherein the reference voltage is within a voltage range of voltages applied to the plurality of gate electrodes.

8. The nonvolatile memory device of claim 5,
   wherein the metal pillar is configured to be grounded.

9. The nonvolatile memory device of claim 1,
   wherein the gate insulating layer includes at least one of SiO, AlO, SiON, and SiN.

10. The nonvolatile memory device of claim 1, further comprising:
    a ferroelectric layer between the plurality of gate electrodes and surrounding the side surface of the gate insulating layer.

11. The nonvolatile memory device of claim 10,
    wherein the ferroelectric layer includes a material represented by $MO_2$ (where M is Hf, Zr, or a combination of Hf and Zr) as a base material.

12. The nonvolatile memory device of claim 10,
    wherein the ferroelectric layer further includes at least one dopant material selected from the group including C, Si, Ge, Sn, Pb, Al, Y, La, Gd, Mg, Ca, Sr Ba, Ti, Zr, Hf, and a combination two or more of C, Si, Ge, Sn, Pb, Al, Y, La, Gd, Mg, Ca, Sr, Ba, Ti, Zr, Hf.

13. The nonvolatile memory device of claim 1,
wherein the gate insulating layer includes:
- a charge tunneling layer through which charges are configured to be tunneled;
- a charge trap layer configured to stored introduced charges; and
- a charge blocking layer configured to block a charge transfer between the charge trap layer and at least one of the plurality of gate electrodes.

14. The nonvolatile memory device of claim 1, further comprising:
- a variable resistance layer in contact with the channel layer between the metal pillar and the channel layer.

15. The nonvolatile memory device of claim 1, further comprising:
- a bit line electrically connected to the drain and configured to apply a voltage to the nonvolatile memory device to perform at least one of program, read, and erase operations.

16. An electronic device comprising:
the nonvolatile memory device according to claim 1; and
at least one active or passive circuit.

17. A memory device comprising:
- a metal pillar;
- a channel layer separated from the metal pillar and surrounding a side surface of the metal pillar;
- a source on one end of the channel layer, the source contacting the metal pillar;
- a drain on another end of the channel layer, the drain overlapping the metal pillar in a direction parallel to a side surface of the channel layer;
- a gate insulating layer surrounding a side surface of the channel layer; and
- a plurality of insulating elements and a plurality of gate electrodes that alternate along a surface of the gate insulating layer and surrounding a side surface of the gate insulating layer, and
- a conductive line in contact with the metal pillar and exposed to outside through the side surface of the channel layer,
wherein the metal pillar, as a body line, overlaps all of the plurality of gate electrodes in a direction perpendicular to the side surface of the channel layer, and the conductive line is disposed between the drain and the plurality of gate electrodes.

18. The memory device of claim 17, wherein the channel layer has a cylindrical shape.

19. The memory device of claim 17, further comprising:
- a substrate, wherein the source is in contact with the substrate.

* * * * *